(12) United States Patent
Oh et al.

(10) Patent No.: US 8,134,170 B2
(45) Date of Patent: Mar. 13, 2012

(54) NITRIDE SEMICONDUCTOR LIGHT EMITTING DEVICE AND METHOD OF MANUFACTURING THE SAME

(75) Inventors: Jeong Tak Oh, Gyunggi-do (KR); Yong Chun Kim, Gyunggi-do (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 79 days.

(21) Appl. No.: 12/620,260

(22) Filed: Nov. 17, 2009

(65) Prior Publication Data

US 2010/0155704 A1     Jun. 24, 2010

(30) Foreign Application Priority Data

Dec. 23, 2008 (KR) .................. 10-2008-0132442

(51) Int. Cl.
*H01L 33/00* (2010.01)
(52) U.S. Cl. .................. 257/98; 257/14; 257/E21.09
(58) Field of Classification Search .................. 257/14, 257/98, E21.09
See application file for complete search history.

(56) References Cited

U.S. PATENT DOCUMENTS

| 6,518,602 | B1 | 2/2003 | Yuasa et al. |
| 2005/0001227 | A1* | 1/2005 | Niki et al. .................. 257/98 |
| 2009/0001409 | A1 | 1/2009 | Takano et al. |

FOREIGN PATENT DOCUMENTS

| JP | 2000-244072 | 9/2000 |
| JP | 2001-77476 | 3/2001 |
| JP | 2005-259970 A | 9/2005 |
| JP | 2007-073630 A | 3/2007 |
| JP | 2008-071773 | 3/2008 |
| JP | 2008-218746 A | 9/2008 |

OTHER PUBLICATIONS

Japanese Office Action w/ English translation thereof, issued in Japanese Patent Application No. 2009-267890 dated Dec. 16, 2011.

* cited by examiner

*Primary Examiner* — Tan N Tran
(74) *Attorney, Agent, or Firm* — McDermott Will & Emery LLP

(57) ABSTRACT

A nitride semiconductor light emitting device, and a method of manufacturing the same are disclosed. The nitride semiconductor light emitting device includes a substrate, an n-type nitride semiconductor layer disposed on the substrate and including a plurality of V-shaped pits in a top surface thereof, an active layer disposed on the n-type nitride semiconductor layer and including depressions conforming to the shape of the plurality of V-shaped pits, and a p-type nitride semiconductor layer disposed on the active layer and including a plurality of protrusions on a top surface thereof. Since the plurality of V-shaped pits are formed in the top surface of the n-type nitride semiconductor layer, the protrusions can be formed on the p-type nitride semiconductor layer as an in-situ process. Accordingly, the resistance to ESD, and light extraction efficiency are enhanced.

5 Claims, 4 Drawing Sheets

NITRIDE SEMICONDUCTOR LIGHT EMITTING DEVICE AND METHOD OF MANUFACTURING THE SAME

CROSS-REFERENCE TO RELATED APPLICATIONS

This application claims the priority of Korean Patent Application No. 10-2008-0132442 filed on Dec. 23, 2008, in the Korean Intellectual Property Office, the disclosure of which is incorporated herein by reference.

BACKGROUND OF THE INVENTION

1. Field of the Invention

The present invention relates to a semiconductor light emitting device and a method of manufacturing the same, and more particularly, to a nitride semiconductor light emitting device and a method of manufacturing the same, which achieves high resistance to electrostatic discharge (ESD) and high light extraction efficiency.

2. Description of the Related Art

Semiconductor light emitting diodes (LEDs), as one type of semiconductor device, generate light of various colors due to electron-hole recombination occurring at a p-n semiconductor junction when current is supplied. These semiconductor LEDs, greatly advantageous over filament-based light emitting devices, have a long useful life span, low power use, superior initial driving characteristics, high vibration resistance and high tolerance to repetitive power connection/disconnection. This has continually boosted the demand for semiconductor LEDs. Notably of late, much attention has been drawn to group III nitride semiconductors capable of emitting light having a short wavelength such as blue light.

In general, group-III nitride semiconductors (hereinafter, referred to as 'nitride semiconductors') have a composition represented by $Al_xGa_yIn_{1-x-y}N$ where $0 \leq x \leq 1$, $0 \leq y \leq 1$ and $1 \leq x+y \leq 1$. The nitride semiconductor light emitting device includes a light emission structure in which an n-type nitride semiconductor layer, an active layer and a p-type nitride semiconductor layer are sequentially grown. Light emission occurs as electrons in the n-type nitride semiconductor layer and holes in the p-type nitride semiconductor layers recombine.

The light efficiency of nitride semiconductor light emitting devices is determined by external quantum efficiency and internal quantum efficiency. The internal quantum efficiency of semiconductor light emitting devices reaches approximately 100%, whereas the external quantum efficiency thereof is considerably lower. This is because the total internal reflection of light generated inside semiconductor light emitting devices occurs due to the different refractive indices of the devices and the air when the light strikes the boundaries of the devices. If light generated inside the devices strikes the boundary of the devices at an angle of incidence larger than the critical angle, the light is reflected internally without being extracted to the outside, significantly undermining the light extraction efficiency of the devices.

Also, nitride semiconductor light emitting devices are susceptible to electrostatic discharge (ESD) from people or objects and are easily damaged. The resistance to ESD is one of the requirements for the high reliability of semiconductor light emitting devices, and thus ESD-related characteristics need to be improved.

SUMMARY OF THE INVENTION

An aspect of the present invention provides a nitride semiconductor light emitting device, which is highly resistant to electrostatic discharge (ESD) and realizes high light extraction efficiency.

According to an aspect of the present invention, there is provided a nitride semiconductor light emitting device including: a substrate; an n-type nitride semiconductor layer disposed on the substrate and including a plurality of V-shaped pits in a top surface thereof; an active layer disposed on the n-type nitride semiconductor layer and including depressions conforming to the shape of the plurality of V-shaped pits; and a p-type nitride semiconductor layer disposed on the active layer and including a plurality of protrusions on a top surface thereof.

The plurality of protrusions may correspond to the plurality of V-shaped pits, respectively.

The plurality of protrusions may have widths greater than the plurality of V-shaped pits.

The nitride semiconductor light emitting device may further include an n-type nitride-based superlattice layer disposed between the n-type nitride semiconductor layer and the active layer and including depressions conforming to the shape of the plurality of V-shaped pits.

The nitride semiconductor light emitting device may further include a p-type nitride-based superlattice layer disposed between the active layer and the p-type nitride semiconductor layer and including depressions conforming to the shape of the plurality of V-shaped pits.

The nitride semiconductor light emitting device may further include: an n-type nitride-based superlattice layer disposed between the n-type nitride semiconductor layer and the active layer and including depressions conforming to the shape of the plurality of V-shaped pits; and a p-type nitride-based superlattice layer disposed between the active layer and the p-type nitride semiconductor layer and including depressions conforming to the shape of the plurality of V-shaped pits.

According to another aspect of the present invention, there is provided a method of manufacturing a nitride semiconductor light emitting device, the method including: growing an n-type nitride semiconductor layer on a top surface of a substrate to form a plurality of V-shaped pits; growing an active layer on the n-type nitride semiconductor layer, the active layer including depressions conforming to the shape of the plurality of V-shaped pits; and growing a p-type nitride semiconductor layer on a top surface of the active layer, the p-type nitride semiconductor layer including a plurality of protrusions.

In the growing of the n-type nitride semiconductor layer, a growth temperature may range from 700° C. to 950° C.

In the growing of the active layer, a growth temperature may be 1000° C. or less.

In the growing of the p-type nitride semiconductor layer, a growth temperature may be 1000° C. or higher.

The p-type nitride semiconductor layer including the plurality of protrusions may be formed by regulating a flow of p-type dopants.

The plurality of protrusions may be grown to correspond to the plurality of V-shaped pits, respectively.

The plurality of protrusions may be grown to have greater widths than the plurality of V-shaped pits.

The method may further include forming an n-type nitride-based superlattice layer, including depressions conforming to the shape of the plurality of V-shaped pits, on the n-type nitride semiconductor layer after the growing of the n-type nitride semiconductor layer.

The method may further include forming a p-type nitride-based superlattice layer, including depressions conforming to the shape of the plurality of V-shaped pits, on the active layer after the growing of the active layer.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
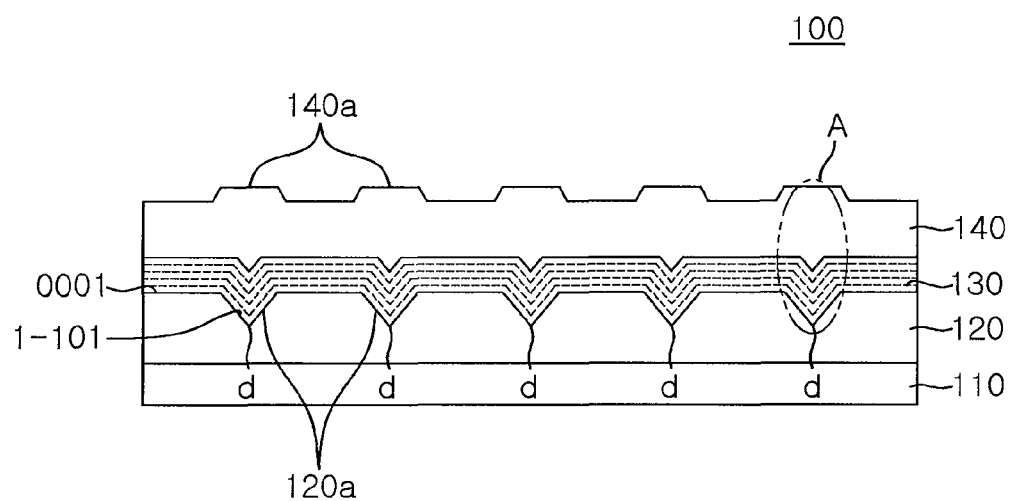
FIG. 1 is a cross-sectional view of a nitride semiconductor light emitting device according to an exemplary embodiment of the present invention.

Exemplary embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity. Like reference numerals in the drawings denote like elements, and thus their description will be omitted.

FIG. 1 is a cross-sectional view of a nitride semiconductor light emitting device according to an exemplary embodiment of the present invention. Referring to FIG. 1, a nitride semiconductor light emitting device 100 includes a substrate 110, an n-type nitride semiconductor layer 120 disposed on the substrate 110, an active layer 130 disposed on the n-type nitride semiconductor layer 120, and a p-type nitride semiconductor layer 140 disposed on the active layer 130. The nitride semiconductor light emitting device 100 may further include an n-electrode (not shown) and a p-electrode (not shown) to supply voltage onto the n-type and p-type nitride semiconductor layers 120 and 140, respectively. The n-electrode may be formed on a region of the n-type nitride semiconductor layer 120 exposed by mesa-etching, and the p-electrode may be formed on the top of the p-type nitride semiconductor layer 140.

As for the substrate 110, an insulating substrate or a semiconductor substrate may be used. Here, the insulating substrate may be formed of sapphire, spinel ($MgAl_2O_4$) or the like, and the semiconductor substrate may be formed of SiC, Si, ZnO, GaAs, GaN or the like. However, the substrate 110 is not limited specifically.

The sapphire substrate is a crystal body having hexa-rhombo R3c symmetry, and has a lattice constant of 13.001 Å in the direction of the c-axis and a distance between lattices of 4.765 Å in the direction of the a-axis. The sapphire substrate has a C-plane (0001), an A-plane (1120), and an R-plane (1102). Since the sapphire substrate is advantageous to the growth of a GaN thin film and is stable at high temperatures, it is primarily used to grow nitrides.

The n-type nitride semiconductor layer 120 and the p-type nitride semiconductor layer 140 may be formed of n-doped and p-doped semiconductor materials having compositions represented by $Al_xIn_yGa_{(1-x-y)}N$ where $0 \leq x \leq 1$, $0 \leq y \leq 1$ and $0 \leq x+y \leq 1$. Representative examples of the semiconductor materials may include GaN, AlGaN and InGaN. The n-type dopants may utilize Si, Ge, Se, Te or C, and the p-type dopants may utilize Mg, Zn or Be.

The n-type nitride semiconductor layer 120 includes a plurality of V-shaped pits 120a in its top surface. A difference in the lattice constant between the substrate 110 and the n-type nitride semiconductor layer 120 creates strain, which acts as a cause of crystalline defects such as dislocations. The plurality of V-shaped pits 120a are formed on dislocations (d) caused by a crystalline defect involving the substrate 110. The method of forming the n-type nitride semiconductor layer 120 including the plurality of V-shaped pits 120a will now be described.

Figure 2:
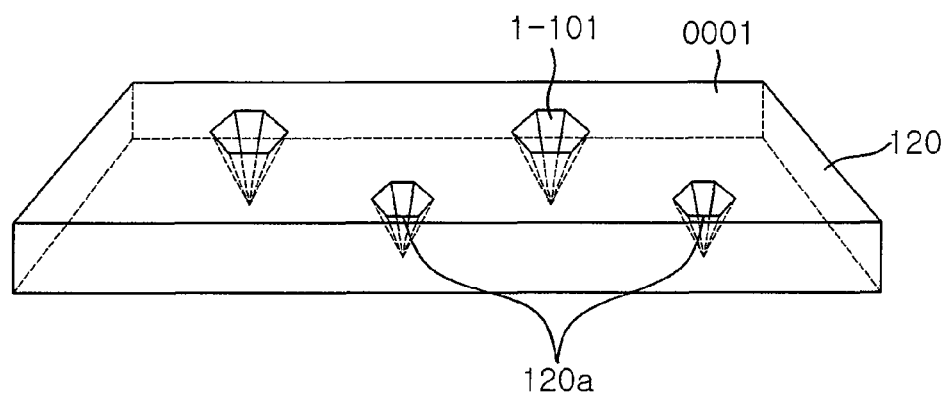
FIG. 2 is a perspective view of an n-type nitride semiconductor layer of the nitride semiconductor light emitting device of FIG. 1.

FIG. 2 is a perspective view of the n-type nitride semiconductor layer 120. Referring to FIG. 2, the n-type nitride semiconductor layer 120 includes a general growth plane (0001) and inclined growth planes (1-101). The n-type nitride semiconductor layer 120 is grown as a general growth plane (0001), but also grown as inclined growth planes (1-101) at portions with dislocations. The inclined growth planes (1-101) allow the formation of the V-shaped pits 120a. In this case, the V-shaped pits each have a hexagonal top surface, and a V-shaped cross-sectional shape.

Nitride semiconductor devices are susceptible to electro-static discharge (ESD), which is caused easily by people or objects in the molding process or in the application to products. However, since current is cut off at a defective portion, the nitride semiconductor device, according to the exemplary embodiment of the present invention, cuts off concentrating current at the V-shaped pits when static electricity is applied, thus enhancing resistance to ESD.

The active layer 130 may have a composition represented by $In_xAl_yGa_{(1-x-y)}N$ where $0 \leq x \leq 1$, $0 \leq y \leq 1$ and $0 \leq x+y \leq 1$, and produces light by electron-hole recombination. The active layer 130 may be a nitride semiconductor layer having a single or multiple quantum well structure.

The active layer 130 is formed on the n-type nitride semiconductor layer 120, and has depressions conforming to the shape of the underlying V-shaped pits 120a in the top of the n-type nitride semiconductor layer 120. When the active layer 130 is formed on the n-type nitride semiconductor layer 120, the vertical and lateral growth rates of the general growth plane (0001) and the inclined growth planes (1-101) are regulated such that the active layer 130 takes on the shape of the V-shaped pits 120a. The formation method of the active layer will be described in detail later.

The p-type nitride semiconductor layer 140 is formed on the active layer 130, and has protrusions 140a on its top surface. In detail, the p-type nitride semiconductor layer 140 is formed on the active layer 130 with its growth conditions regulated so as to cover the depressions of the active layer 130. Also, the protrusions 140a of the p-type nitride semiconductor layer 140 are formed by regulating the flow of p-type dopants. In detail, the amount of p-type dopants increases in the portions of the p-type nitride semiconductor layer 140 corresponding to the depressions of the active layer 130, thus accelerating the growth of the corresponding portions of the p-type nitride semiconductor layer 140. In such a manner, the protrusions 140a are formed. Accordingly, the resistance to ESD and light extraction efficiency can be enhanced. The growth method will be described in detail later.

Figure 3:
FIG. 3 is a light microscope (LM) image showing the top surface of a p-type nitride semiconductor layer according to the exemplary embodiment of FIG. 1.

FIG. 3 is a light microscope (LM) image showing the top surface of the p-type nitride semiconductor layer 140 according to the exemplary embodiment of the present invention. Referring to FIG. 3, the plurality of protrusions can be observed on the top surface of the p-type nitride semiconductor layer 140.

The protrusions on the top surface of the p-type nitride semiconductor layer 140 enhance light extraction efficiency. As for the related art semiconductor light emitting devices, when light produced in active layers is emitted to the air (to Si or the like in the case of packages) through p-type nitride semiconductor layers, light being incident at an angle greater than the critical angle is trapped inside, without being extracted to the outside. However, the semiconductor light emitting device, according to the exemplary embodiment of the present invention, increases the rate of light falling at an angle of incidence less than the critical angle since the light path is changed due to the protrusions of the p-type nitride semiconductor layer.

Figure 4:
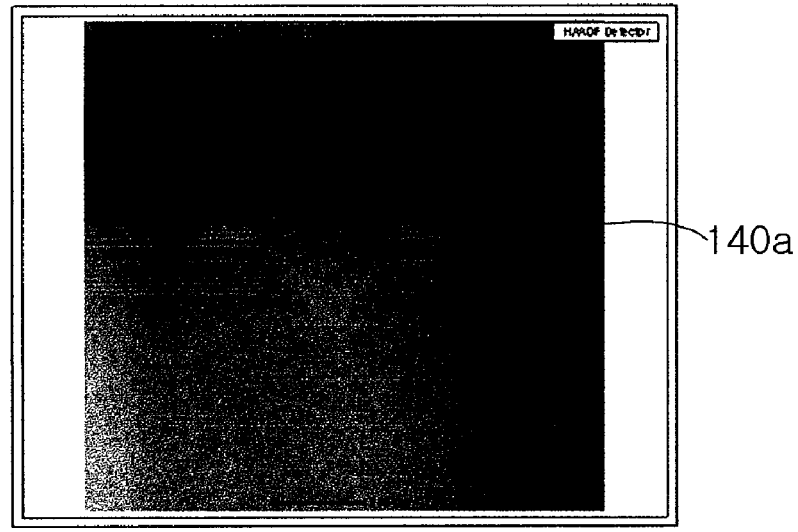
FIG. 4 is a transmission electron microscope (TEM) image showing a portion of the nitride semiconductor light emitting device according to the exemplary embodiment of the present invention.

FIG. 4 is a transmission electron microscope (TEM) image showing a region 'A' of the nitride semiconductor light emitting device 100 of FIG. 1.

The plurality of protrusions 140a have widths and heights that can be controlled by growth conditions, and have the highest density in the p-type nitride semiconductor layer. The protrusions 140a may correspond to the V-shaped pits formed in the n-type nitride semiconductor layer, respectively, and have greater widths than the V-shaped pits in order to enhance light extraction efficiency. The widths of the protrusions 140a may range from a few angstroms (Å) to a few micrometers (μm). Although not limited to, the protrusions 140a may have widths between 10 Å to 2000 nm and heights between 1 nm to 10000 nm.

Figure 5:
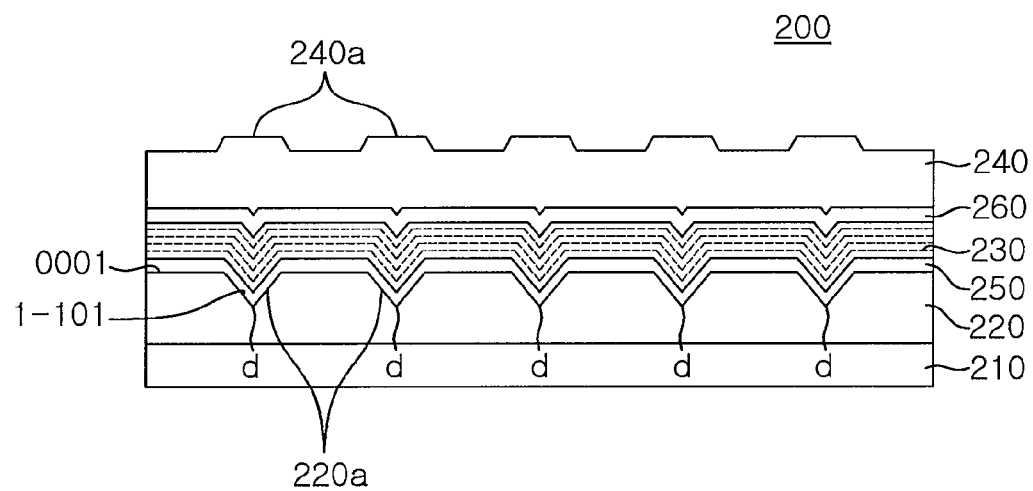
FIG. 5 is a cross-sectional view of a nitride semiconductor light emitting device according to another exemplary embodiment of the present invention.

FIG. 5 is a cross-sectional view of a nitride semiconductor light emitting device according to another exemplary embodiment of the present invention. Referring to FIG. 5, a nitride semiconductor light emitting device 200 according to this embodiment includes a substrate 210, an n-type nitride semiconductor layer 220 disposed on the substrate 210, an active layer 230 disposed on the n-type nitride semiconductor layer 220, and a p-type nitride semiconductor layer 240 disposed on the active layer 230. The nitride semiconductor light emitting device 200 may further include an n-electrode (not shown) and a p-electrode (not shown) to supply voltage onto the n-type and p-type nitride semiconductor layers 220 and 240. Here, the n-electrode may be disposed on a region of the n-type nitride semiconductor layer 220 exposed by mesa-etching, and the p-electrode may be disposed on the p-type nitride semiconductor layer 240.

According to this embodiment, an n-type nitride-based superlattice layer 250 may be provided between the n-type nitride semiconductor layer 220 and the active layer 230. The n-type nitride-based superlattice layer 250 may be formed by laminating a plurality of AlGaN/GaN/InGaN layers, but is not limited thereto. The n-type nitride-based superlattice layer 250 may have depressions conforming to the shape of the V-shaped pits 220a formed in the top surface of the n-type nitride semiconductor layer 220.

Also, a p-type nitride-based superlattice layer 260 may be provided between the active layer 230 and the p-type nitride semiconductor layer 240. The p-type nitride-based superlattice layer 260 may be formed by laminating a plurality of AlGaN/GaN/InGaN layers, but not limited thereto. The p-type nitride-based superlattice layer 260 has depressions conforming to the shape of the underlying V-shaped pits 220a in the top surface of the n-type nitride semiconductor layer 220. In more detail, the depressions in the top surface of the p-type nitride-based superlattice layer 260 are formed due to the depressions in the top surface of the active layer 230.

In this embodiment, like elements are named like terms to those in the embodiment of FIG. 1, and thus are not described herein.

Figure 6:
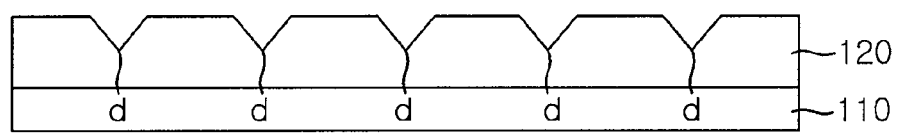
FIGS. 6 through 8 are cross-sectional views showing a method of manufacturing a nitride semiconductor light emitting device, according to an exemplary embodiment of the present invention.
Figure 7:
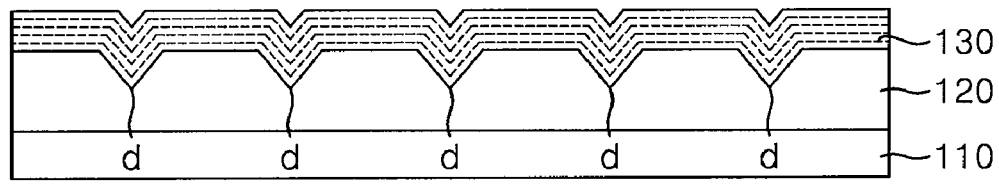
Figure 8:
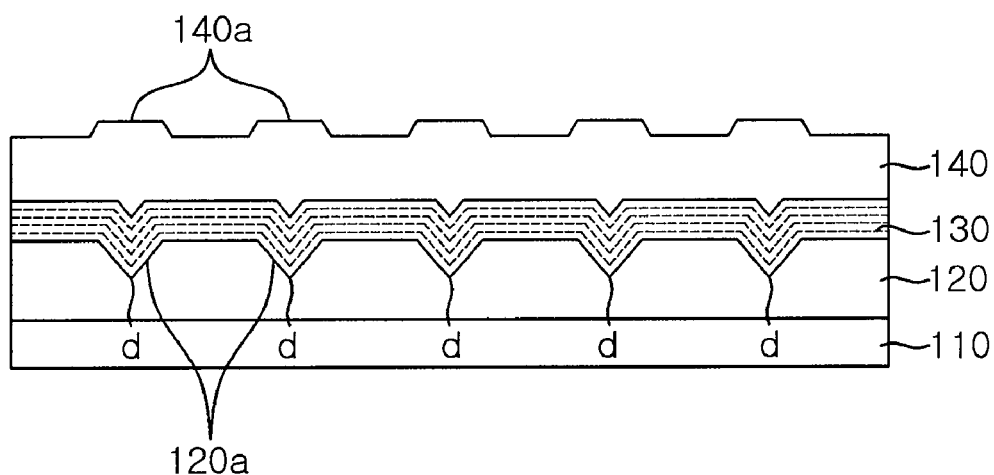

Hereinafter, a method of manufacturing the nitride semiconductor light emitting device will now be described. FIGS. 6 through 8 are cross-sectional views showing a method of manufacturing a nitride semiconductor light emitting device, according to an exemplary embodiment of the present invention.

An n-type nitride semiconductor layer, an active layer and a p-type nitride semiconductor layer may be grown by use of a known process, such as such as metal organic chemical vapor (MOCVD), molecular beam epitaxy (MBE) or hydride vapor phase epitaxy (HVPE).

Hereinafter, a method adopting MOCVD will now be described in detail.

As shown in FIG. 6, a substrate 110 for growth is provided, and an n-type nitride semiconductor layer 120 is grown thereon.

Due to a difference in the lattice constant between the substrate 110 and the n-type nitride semiconductor layer 120, strain is created, thus causing dislocations (d) in the substrate 110 and the n-type nitride semiconductor layer 120. In an atmosphere of a nitrogen carrier gas, the growth of the n-type nitride semiconductor layer 120 is suppressed in portions thereof having the dislocations (d) by controlling the temperature, thus forming inclined growth planes. The inclined growth planes at the dislocations (d) allow the formation of the V-shaped pits 120a. The growth temperature may range from 700° C. to 950° C.

Also, the n-type nitride semiconductor layer including the plurality of V-shaped pits may be grown on the substrate 110 by controlling the flow quantity of precursors or internal pressure.

The concentration of n-type dopants of the n-type nitride semiconductor layer 120 may range from $1\times10^{17}$ to $5\times10^{21}$. An increase in the concentration of the n-type dopants may bring about the effect of decreasing forward voltage (Vf) but degrade crystalline properties. For this reason, the concentration of the n-type dopants may be determined within the range that does not undermine the crystalline properties.

As shown in FIG. 7, an active layer 130, having a multiple quantum well structure of alternating quantum barrier and quantum well layers, is grown on the n-type nitride semiconductor layer 120. The active layer 130 has depressions formed due to the plurality of V-shaped pits in the top surface of the n-type nitride semiconductor layer 120. When the active layer 130 is grown on the n-type nitride semiconductor layer 120, the vertical and lateral growth rates of the general growth plane and the inclined growth planes of the n-type nitrides semiconductor layer 120 are regulated so as to form depressions in the active layer 130, which conform to the shape of the V-shaped pits. The growth rates may be regulated by controlling the flow quantity of precursors, the pressure and the growth temperature. For example, if the growth temperature is controlled, the temperature may be maintained at 1000° C. or less.

An n-type nitride superlattice layer (not shown) may be formed on the n-type nitride semiconductor layer 120 before the growth of the active layer 130. The n-type nitride superlattice layer may be formed by laminating a plurality of AlGaN/GaN/InGaN layers.

The n-type nitride superlattice layer includes depressions conforming to the shape of the V-shaped pits in the top surface of the n-type nitride semiconductor layer 120. The detailed growth method is similar to the growth method of the active layer 130.

As shown in FIG. 8, the p-type nitride semiconductor layer 140 is grown on the active layer 130. The p-type nitride semiconductor layer 140 is grown to cover the plurality of V-shaped pits without forming depressions, by regulating vertical and lateral growth rates. The growth rates may be regulated by controlling the flow quantity of precursors, the pressure and the growth temperature. For example, the growth temperature may be maintained at 1000° C. or higher.

Protrusions 140a may be formed on the top surface of the p-type nitride semiconductor layer 140 by controlling the flow of p-type dopants. The p-type dopants may utilize Mg, Zn or Be, and more preferably Mg, but is not limited thereto.

The plurality of protrusions 140a may be grown to correspond to the plurality of V-shaped pits in the top surface of the n-type nitride semiconductor layer 120, respectively.

The active layer 130 has depressions in its top surface. Since the p-type dopants are smoothly injected at a region corresponding to the underlying depressions, the growth rate of the corresponding region becomes high and thus protrusions may be formed. The widths and heights of the protrusions may be adjusted by controlling growth conditions.

The nitride semiconductor light emitting device according to the present invention may be manufactured as an in-situ process in terms of the formation of the protrusions on the top surface of the p-type nitride semiconductor layer 140. Thus, the process can be simplified, and the generation of foreign bodies or oxide layers due to exposure to the air can be prevented.

A p-type nitride-based superlattice layer (not shown) may be formed on the active layer 130 before the growth of the p-type nitride semiconductor layer 140. Here, the p-type nitride superlattice layer may be formed by laminating a plurality of AlGaN/GaN/InGaN layers.

The p-type nitride superlattice layer includes depressions conforming to the shape of the V-shaped pits in the top surface of the n-type nitride semiconductor layer. The detailed growth method is similar to that of the active layer 130.

As set forth above, according to exemplary embodiments of the invention, the plurality of V-shaped pits are formed in the top surface of the n-type nitride semiconductor layer, so that the protrusions may be formed in the top surface of the p-type nitride semiconductor layer as an in-situ process. When static electricity is supplied, currents concentrate due to the plurality of V-shaped pits and the protrusions, thus enhancing the resistance to ESD and increasing the rate of light falling at an angle of incidence less than the critical angle. Accordingly, light extraction efficiency is improved.

While the present invention has been shown and described in connection with the exemplary embodiments, it will be apparent to those skilled in the art that modifications and variations can be made without departing from the spirit and scope of the invention as defined by the appended claims.

What is claimed is:

1. A nitride semiconductor light emitting device comprising:
   a substrate;
   an n-type nitride semiconductor layer disposed on the substrate and including a plurality of V-shaped pits in a top surface thereof;
   an active layer disposed on the n-type nitride semiconductor layer and including depressions conforming to the shape of the plurality of V-shaped pits; and
   a p-type nitride semiconductor layer disposed on the active layer and including a plurality of protrusions on a top surface thereof,
   wherein the plurality of protrusions correspond to the plurality of V-shaped pits to overlap in a vertical direction, respectively.

2. The nitride semiconductor light emitting device of claim 1, wherein the plurality of protrusions have widths greater than the plurality of V-shaped pits.

3. The nitride semiconductor light emitting device of claim 1, further comprising an n-type nitride-based superlattice layer disposed between the n-type nitride semiconductor layer and the active layer and including depressions conforming to the shape of the plurality of V-shaped pits.

4. The nitride semiconductor light emitting device of claim 1, further comprising a p-type nitride-based superlattice layer disposed between the active layer and the p-type nitride semiconductor layer and including depressions conforming to the shape of the plurality of V-shaped pits.

5. The nitride semiconductor light emitting device of claim 1, further comprising:
   an n-type nitride-based superlattice layer disposed between the n-type nitride semiconductor layer and the active layer and including depressions conforming to the shape of the plurality of V-shaped pits; and
   a p-type nitride-based superlattice layer disposed between the active layer and the p-type nitride semiconductor layer and including depressions conforming to the shape of the plurality of V-shaped pits.

* * * * *